United States Patent
Son et al.

(10) Patent No.: US 7,423,996 B2
(45) Date of Patent: Sep. 9, 2008

(54) METHOD AND APPARATUS FOR WEIGHTED NON-BINARY REPEAT ACCUMULATE CODING AND SPACE-TIME CODING

(75) Inventors: Jungmin Son, Pohang-shi (KR);
Kyeongchul Yang, Seoul (KR); Jae-Yoel Kim, Kunpo-shi (KR)

(73) Assignee: Samsung Electronics Co., Ltd. (KR)

( * ) Notice: Subject to any disclaimer, the term of this patent is extended or adjusted under 35 U.S.C. 154(b) by 1076 days.

(21) Appl. No.: 10/345,556

(22) Filed: Jan. 16, 2003

(65) Prior Publication Data

US 2003/0235166 A1    Dec. 25, 2003

(30) Foreign Application Priority Data

Jan. 16, 2002  (KR)  .............. 10-2002-0002414

(51) Int. Cl.
*H03M 13/03* (2006.01)
*H04B 7/216* (2006.01)
*H04J 11/00* (2006.01)

(52) U.S. Cl. .............. 370/335; 714/786; 714/792

(58) Field of Classification Search .......... 370/342; 714/786
See application file for complete search history.

(56) References Cited

U.S. PATENT DOCUMENTS

| | | | | | |
|---|---|---|---|---|---|
| 4,383,323 | A | * | 5/1983 | Timor | 375/135 |
| 5,479,416 | A | * | 12/1995 | Snodgrass et al. | 714/785 |
| 5,608,739 | A | * | 3/1997 | Snodgrass et al. | 714/785 |
| 5,623,485 | A | * | 4/1997 | Bi | 370/209 |
| 5,914,933 | A | * | 6/1999 | Cimini et al. | 370/208 |
| 6,014,411 | A | * | 1/2000 | Wang | 375/259 |
| 6,215,762 | B1 | * | 4/2001 | Dent | 370/208 |
| 6,728,927 | B2 | * | 4/2004 | Crozier | 714/790 |

(Continued)

FOREIGN PATENT DOCUMENTS

EP    0 758 168    2/1997

(Continued)

OTHER PUBLICATIONS

Sae-Young Chung et al., "Analysis of Sum-Product Decoding of Low-Density Parity-check Codes Using a Gaussian Approximation", IEEE Transactions on Information Theory, vol. 47, No. 2, Feb. 2001, pp. 657-670.

(Continued)

*Primary Examiner*—Chau T. Nguyen
*Assistant Examiner*—Marcus R Smith
(74) *Attorney, Agent, or Firm*—The Farrell Law Firm, PC (57) ABSTRACT

An apparatus and method for weighted non-binary RA coding and space-time coding are disclosed. Transmission data is divided in the units of frames each having mN bits, and each frame is further segmented into N blocks, each block containing m bits. The N blocks are converted to N non-binary $GF(2^m)$ elements. These N non-binary symbols are repeated by a repetition factor r. The rN symbols are multiplied by weighting factors being $GF(2^m)$ elements other than zero. The rN weighted symbols are interleaved and accumulated. The rN accumulated symbols are transmitted to a receiver, or each of the rN accumulated symbols is demapped to m bits prior to transmission. Therefore, information can be transmitted reliably in a wireless communication system.

36 Claims, 5 Drawing Sheets

U.S. PATENT DOCUMENTS

| | | | |
|---|---|---|---|
| 2001/0001617 A1* | 5/2001 | Koga et al. | 375/347 |
| 2001/0003088 A1* | 6/2001 | Ogino et al. | 455/13.4 |
| 2001/0003208 A1* | 6/2001 | Wan | 714/800 |
| 2002/0021686 A1* | 2/2002 | Ozluturk et al. | 370/342 |
| 2002/0184593 A1* | 12/2002 | Dohmen et al. | 714/784 |

FOREIGN PATENT DOCUMENTS

| | | |
|---|---|---|
| WO | WO 01/56218 | 8/2001 |
| WO | WO 01/95500 | 12/2001 |

OTHER PUBLICATIONS

British Search Report dated May 1, 2003, issued in a counterpart application, namely, Appln. No. GB 0301002.2.

Sae-Young Chung et al., "Analysis of Sum-Product Decoding of Low-Density Parity-Check Codes Using a Gaussian Approximation," IEEE Transactions on Information Theory, Feb. 2001, vol. 47, pp. 657-670.

Brian L. Hughes, "Space-Time Group Codes," IEEE, Thirty-Fourth Asilomar Conference on Signals, Systems and Computers, Oct. 29-Nov. 1, 2000. pp. 699-704.

European Search Report dated May 26, 2003 issued in a counterpart application, namely Appln No. 03000670.4.

* cited by examiner

METHOD AND APPARATUS FOR WEIGHTED NON-BINARY REPEAT ACCUMULATE CODING AND SPACE-TIME CODING

PRIORITY

This application claims priority under 35 U.S.C. § 119 to an application entitled "Method and Apparatus for Weighted Non-Binary Repeat Accumulate Coding and Space-Time Coding" filed in the Korean Industrial Property Office on Jan. 16, 2002 and assigned Serial No. 2002-2414, the contents of which are hereby incorporated herein by reference.

BACKGROUND OF THE INVENTION

1. Field of the Invention

The present invention relates generally to a channel coder and a channel coding method in a mobile communication system using multiple antennas for efficiently correcting errors in a channel at a receiver, and in particular, to an apparatus and method for error correction coding that helps detection and correction of errors in a channel with high reliability in a wireless communications system.

2. Description of the Related Art

In a mobile communication system, a transmitter adds a corresponding parity data stream to information data so that a receiver can receive the information data correctly. This coding technique can be implemented in different coders in the transmitter: a Reed-Solomon coder, a convolutional coder, a turbo coder, and a concatenated Reed-Solomon and convolutional coder. The concatenated coder comprises two constituent coders and an interleaver that connects them.

Figure 1:
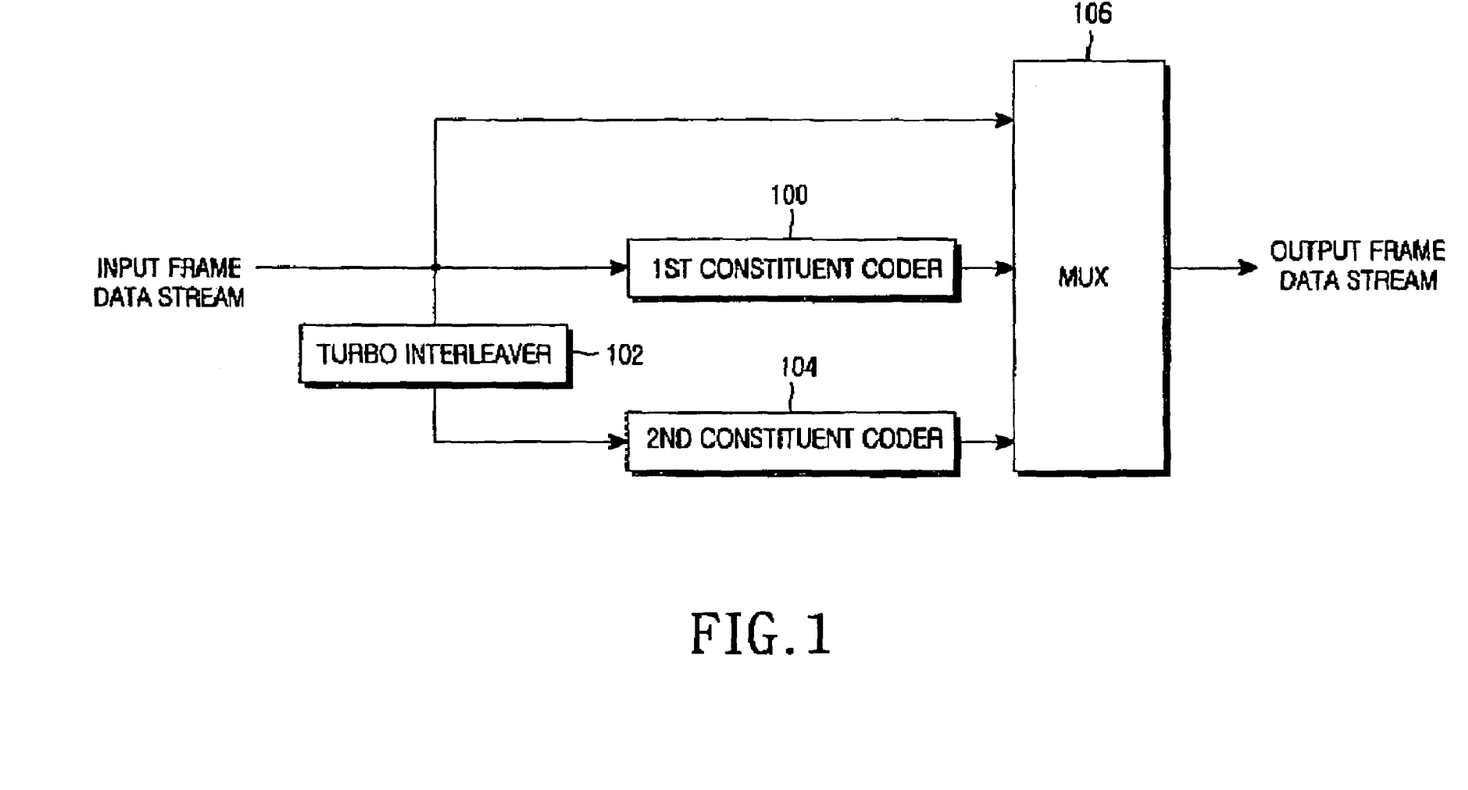
FIG. 1 is a block diagram of a typical turbo coder.

FIG. 1 is a block diagram of a typical turbo coder. Referring to FIG. 1, the turbo coder includes a first constituent coder 100, a turbo interleaver 102, a second constituent coder 104, and a multiplexer (MUX) 106. In operation, an input frame data stream is simply output to the MUX 106 and fed to both the first constituent coder 100 and the turbo interleaver 102. The first constituent coder 100 codes the frame data stream and the turbo interleaver 102 interleaves it. The second constituent coder 104 encodes the interleaved data. The MUX 106 multiplexes the input frame data stream and the data received from the first and second constituent coders 100 and 104. Here, the turbo interleaver 102 permutes the sequence of the information bits of the frame data stream and generates interleaver addresses according to its interleaver size. This turbo interleaver 102 functions to maximize turbo coding performance.

As illustrated in FIG. 1, for the input of one input frame data stream, the turbo coder with a code rate of ⅓ outputs three frame data streams, which are the input frame data stream and two parity frame data streams for correcting the input frame data stream.

If received frame data streams have a full rank, excellent error correction performance can be achieved at a receiver. Hereinbelow, rank will first be described.

Let the input frame data stream be [1 1 0] and the turbo coder output be $$\begin{pmatrix} 1 & 1 & 0 \\ 1 & 0 & 1 \\ 0 & 1 & 1 \end{pmatrix}$$

That is, the first constituent coder 100 outputs [1 0 1] and the second constituent coder 104 outputs [0 1 1]. A rank is determined using the sum of the other columns or the subtraction between the other columns excepting a particular column in the matrix. The third column of the above matrix can be represented as the sum of the first and second columns. Excepting the third column, there remain two columns. Thus the rank of the output frame data stream is 2. A full rank is defined where it is impossible to represent a particular column as the sum of the other columns or the subtraction between the other columns. A full-rank model is given below.

output frame data stream:

$$\begin{pmatrix} 1 & 1 & 1 \\ 1 & 0 & 1 \\ 0 & 1 & 1 \end{pmatrix}$$

When coding using binary codes, the output frame data stream is generally of a full rank. However, it is not of a full rank if non-binary codes are used. That is, a non-binary coder, which repeats an input frame data stream a predetermined number of times, outputs a frame data stream in a matrix where a particular column can be represented as the sum of the other columns or the difference between the other columns. Thus, it is difficult to recover the original frame data stream using the received frame data stream at the receiver. Accordingly, there is a need for a full-rank error correction coder using non-binary codes.

SUMMARY OF THE INVENTION

It is, therefore, an object of the present invention to provide a non-binary repeat accumulate (RA) coder having a full rank and a coding method thereof.

It is another object of the present invention to provide an error correction coder and an error correction coding method using a full-rank non-binary RA (Repeat-Accumulate) coder, which offer high reliability by enabling a receiver to recover a received data stream correctly in a wireless communications system.

It is a further object of the present invention to provide a space-time coder and a space-time coding method that achieve unity data rate and maximum antenna diversity in a wireless communications system.

To achieve the above and other objects, transmission data is divided in the units of frames each having mN bits, and each frame is further segmented into N blocks, each block containing m bits. The N blocks are converted to N non-binary $GF(2^m)$ elements. These N non-binary symbols are repeated by a repetition factor r. The rN symbols are multiplied by weighting factors being $GF(2^m)$ elements other than zero. The rN weighted symbols are interleaved and accumulated. The rN accumulated symbols are transmitted to a receiver, or each of the rN accumulated symbols is mapped to m binary bits prior to transmission. Therefore, information can be transmitted reliably in a wireless communication system.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. In the following description, well-known functions or constructions are not described in detail where they are well-known in the art.

Gaussian Approximation is useful for evaluation of the performance of a coder using a Sum-Product decoding algorithm such as RA codes or low-density parity check (LDPC) codes (see S. Y. Chung, T. J. Richardson, and L. Urbanke, Analysis of Sum-Product Decoding of Low-Density Parity-Check Codes Using a Gaussian Approximation, IEEE Trans. Inform. Theory, vol. 47, pp. 657-670, February 2001). For Gaussian Approximation, non-binary codes are represented as binary codes. The non-binary code symbols can be elements of a finite field, especially elements of a Galois Field $GF(2^m)$ and the correlation between the binary code symbols and the non-binary code symbols is based on the finite field theory. This will be apparent in embodiments of the present invention. When the non-binary code symbols are represented as binary code symbols to improve the performance of RA codes using the Sum-Product decoding algorithm, repeated code symbols have regularity and thus repeated symbols in a parity check matrix for the Sum-Product decoding algorithm are independent of each other. Therefore, in the case of non-binary RA codes, the simple repetition degrades the performance of the Sum-Product decoding algorithm. The independence of the binary code symbols in the parity check matrix can be avoided by achieving a different representation of the repeated code symbols. The simplest, most efficient way is to use a weighter. The weighter increases the correlation between repeated symbols by randomizing output of the weighter. As a result, when the Sum-Product decoding algorithm is used at a decoder, decoding performance is increased.

Figure 2:
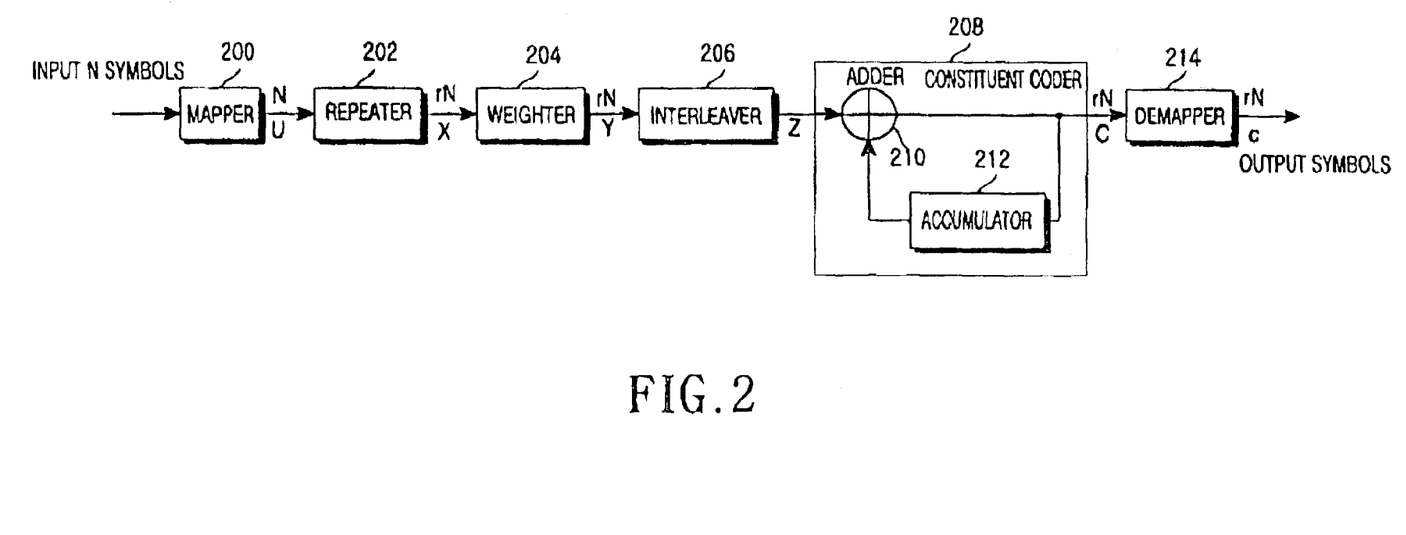
FIG. 2 is a block diagram of an RA coder according to the present invention.

FIG. 2 is a block diagram of a non-binary RA coder according to the present invention. Referring to FIG. 2, the non-binary RA coder comprises a mapper 200, a repeater 202, a weighter 204, an interleaver 206, a coder 208, and a demapper 214. The mapper 200 receives N blocks, each block including m bits, that is, total number of input bits is mN-bit. This frame is a binary representation of transmission data. The mapper 200 converts the input binary bit stream to a non-binary bit stream. While the mapper 200 can be implemented in many ways, it uses the Galois Field (GF) in the present invention. Yet, it is obviously to be understood that a binary-non-binary mapping method is not confined to the GF-based method.

If m is 3, the input frame can be expressed as a binary bit stream $u_0, u_1, u_2, \ldots, u_{3N-1}$. The mapper 200 maps 3N bits to N symbols, that is, maps an $i^{th}$ block (i=0 to (3N−1)/3) having 3 bits, $(u_{3i}, u_{3i+1}, u_{3i+2})$ to an element of $GF(2^3)$, $U_i$. The $GF(2^3)$ element, $U_i$ corresponding to 3 bits is called a symbol. Table 1 illustrates mapping of binary bits to non-binary bits in the $GF(2^3)$.

TABLE 1

| $u_{3i}, u_{3i+1}, u_{3i+2}$ | Addition | Multiplication |
|---|---|---|
| 000 | 0 | 0 |
| 100 | 1 | $1 = a^7$ |
| 010 | a | a |
| 110 | $1 + a$ | $a^3$ |
| 001 | $a^2$ | $a^2$ |
| 101 | $1 + a^2$ | $a^6$ |
| 011 | $a + a^2$ | $a^4$ |
| 111 | $1 + a + a^2$ | $a^5$ |

As illustrated in Table 1, although the mapper 200 maps input blocks to non-binary symbols by GF addition (vector representation) or GF multiplication, the present invention will be described in the context of the GF addition.

The GF addition representation of binary bits equivalent to their GF multiplication representation will be described below. A generator polynomial of non-binary codes over $GF(2^3)$ in a mobile communication system is defined as $$f(x) = x^3 + x + 1 \quad (1)$$

where f(x) is a primitive polynomial over $GF(2^3)$ and if a is a primitive element of $GF(2^3)$, the following Eq. (2) is satisfied $$f(a) = 0 \quad (2)$$

Thus the generator polynomial is $a^3 + a + 1 = 0$ (i.e., $a^3 = a + 1$). An arbitrary symbol can be expressed as a linear combination of 1, a, and $a^2$. For $a^4$(0 1 1), $$a^4 = aa^3 = a(a+1) = a^2 + a$$

In this manner, the GF addition representation of binary bits can be derived from their GF multiplication representation, as illustrated in Table 1. As stated before, a 3-bit block $(u_{3i}, u_{3i+1}, u_{3i+2})$ is converted to an element of $GF(2^3)$, $U_i$ being a non-binary symbol. For the input of N 3-bit binary blocks, the mapper 200 outputs symbols $U_0, U_1, U_2, \ldots, U_{N-1}$. A set of the output symbols is called an element sequence.

These N symbols are provided to the repeater 202. A repetition factor is determined according to a data rate. If the repetition factor is r, the data rate is r/m (where m is the number of binary bits per output symbol U and is equal to the number of the transmit antennas). To obtain a maximum data rate, r is set to m(r=m). For example, if m is 3, r is 3.

Thus, the repeater 202 repeats the input non-binary symbols $U_0, U_1, U_2, \ldots, U_{N-1}$ three times and thus outputs non-binary symbols $X_0, X_1, X_2, \ldots, X_{3N-1}$, which are expressed as $$X_{3i} = X_{3i+1} = X_{3i+2} = U_i \, i = 0, 1, 2, \ldots N-1 \quad (3)$$

Since for the input of one non-binary symbol, the repeater 202 outputs three identical non-binary symbols as illustrated in Eq. (3), they are not of a full rank. To realize the full rank, $X_0, X_1, X_2, \ldots, X_{3N-1}$ are provided to the weighter 204.

The weighter 204 multiplies an $i^{th}$ input non-binary symbol by a weighting factor $\beta_i$ being a $GF(2^3)$ element. In an embodiment of the present invention, the number of weighting factors used in the weighter 204 is equal to the repetition factor r and weighting factors are not zero. Specifically, the weighter 204 multiplies three identical non-binary symbols received from the repeater 202 by three different weighting factors, respectively. While the GF is used here, it is a mere exemplary application. Thus, any weighting factors can be used as far as weighting the repeated non-binary symbols with the weighting factors results in a full rank. If the weighted non-binary symbols are $Y_0, Y_1, Y_2, \ldots, Y_{3N-1}$, $$Y_i \beta_i X_i \quad i = 0, 1, 2, \ldots, 3N-1$$

The interleaver 206 interleaves $Y_0, Y_1, Y_2, \ldots, Y_{3N-1}$ on a symbol basis and outputs interleaved symbols $Z_0, Z_1, Z_2, \ldots, Z_{3N-1}$ to the constituent coder 208. The interleaver 206 functions to permute the sequence of the received symbols.

The coder 208 is an accumulator comprising an adder 210 and a register 212, but a one-tap or two-tap RSC (Recursive Systematic Convolutional) coder can substitute for them. For the input of the interleaver output $Z_0, Z_1, Z_2, Z_{3N-1}$, the coder 208 outputs $C_0, C_1, C_2, \ldots, C_{3N-1}$.

$$C_i = \sum_{j=0}^{i} Z_j \quad i = 0, 1, 2, \ldots, 3N-1 \quad (5)$$

The demapper 214 demaps each of the non-binary symbols $C_0, C_1, C_2, \ldots, C_{3N-1}$ received from the coder 208 to a plurality of binary bits. Since the demapper 214 operates in the order reverse to the mapping in the mapper 200, it converts each non-binary symbol over the $GF(2^3)$ to 3 binary bits. If the mapper 200 operates differently, the demapper 214 also operates correspondingly. The demapper 214 maps an element of $GF(2^3)$, $C_i$ to a binary symbol $(c_{i1}, c_{i2}, c_{i3})$. The demapper output is transmitted to a receiver through an antenna.

Figure 3:
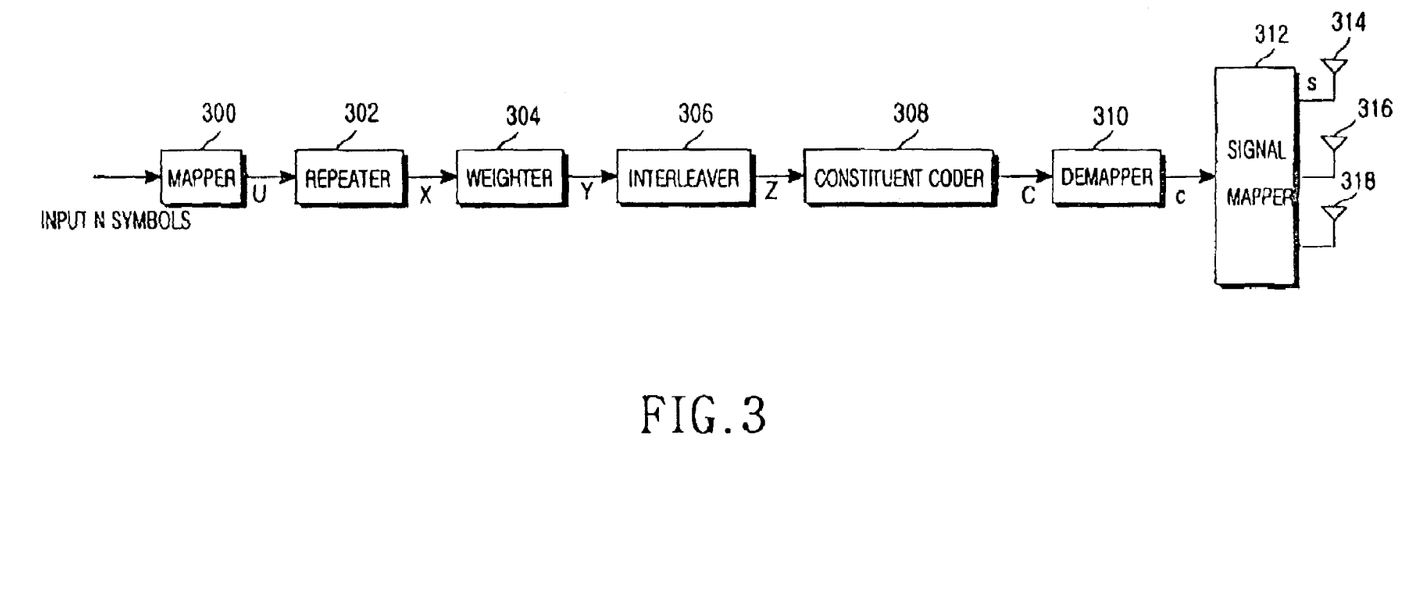
FIG. 3 is a block diagram of an embodiment of a space-time coder according to the present invention.
Figure 4:
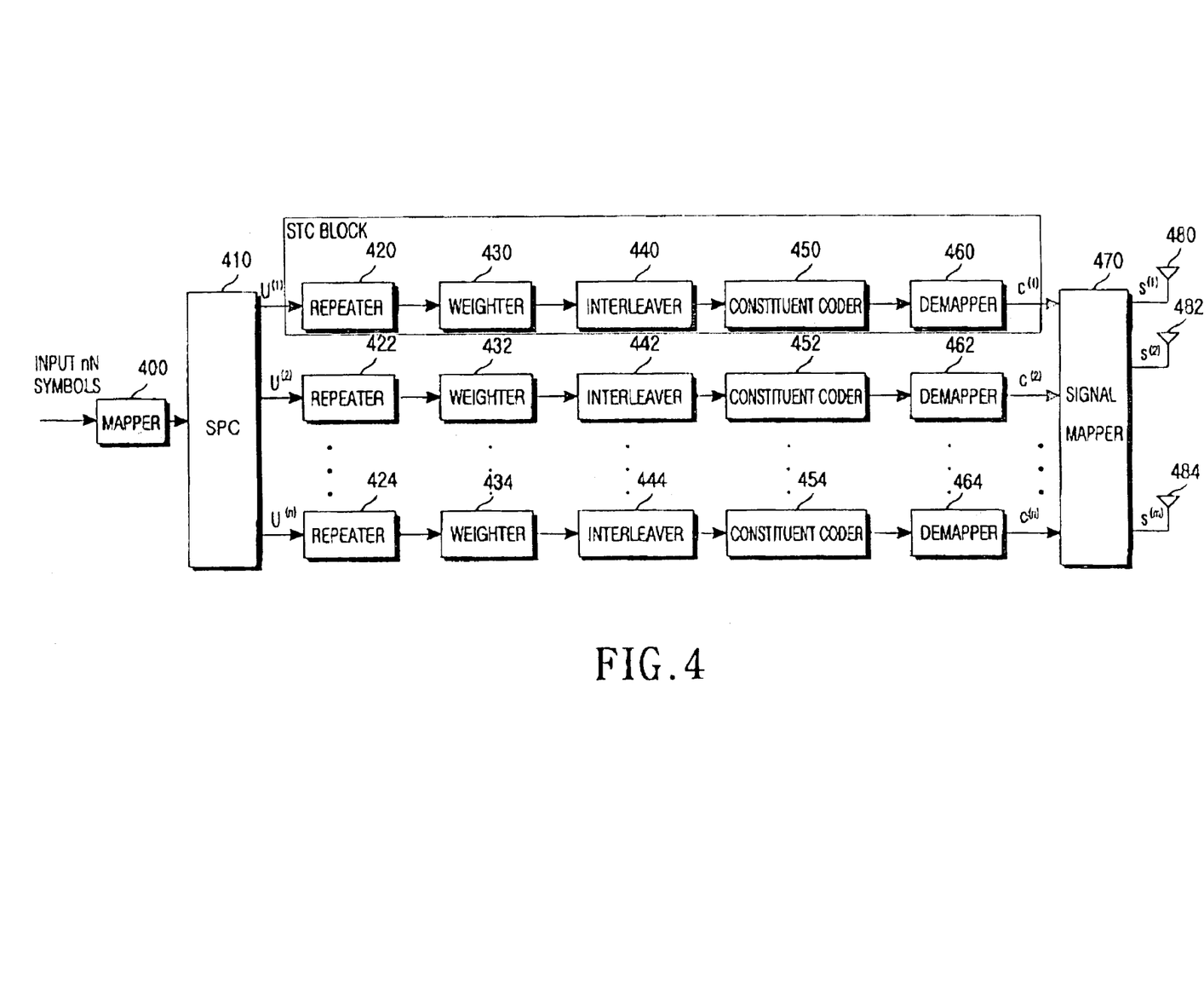
FIG. 4 is a block diagram of another embodiment of the space-time coder according to the present invention.
Figure 5:
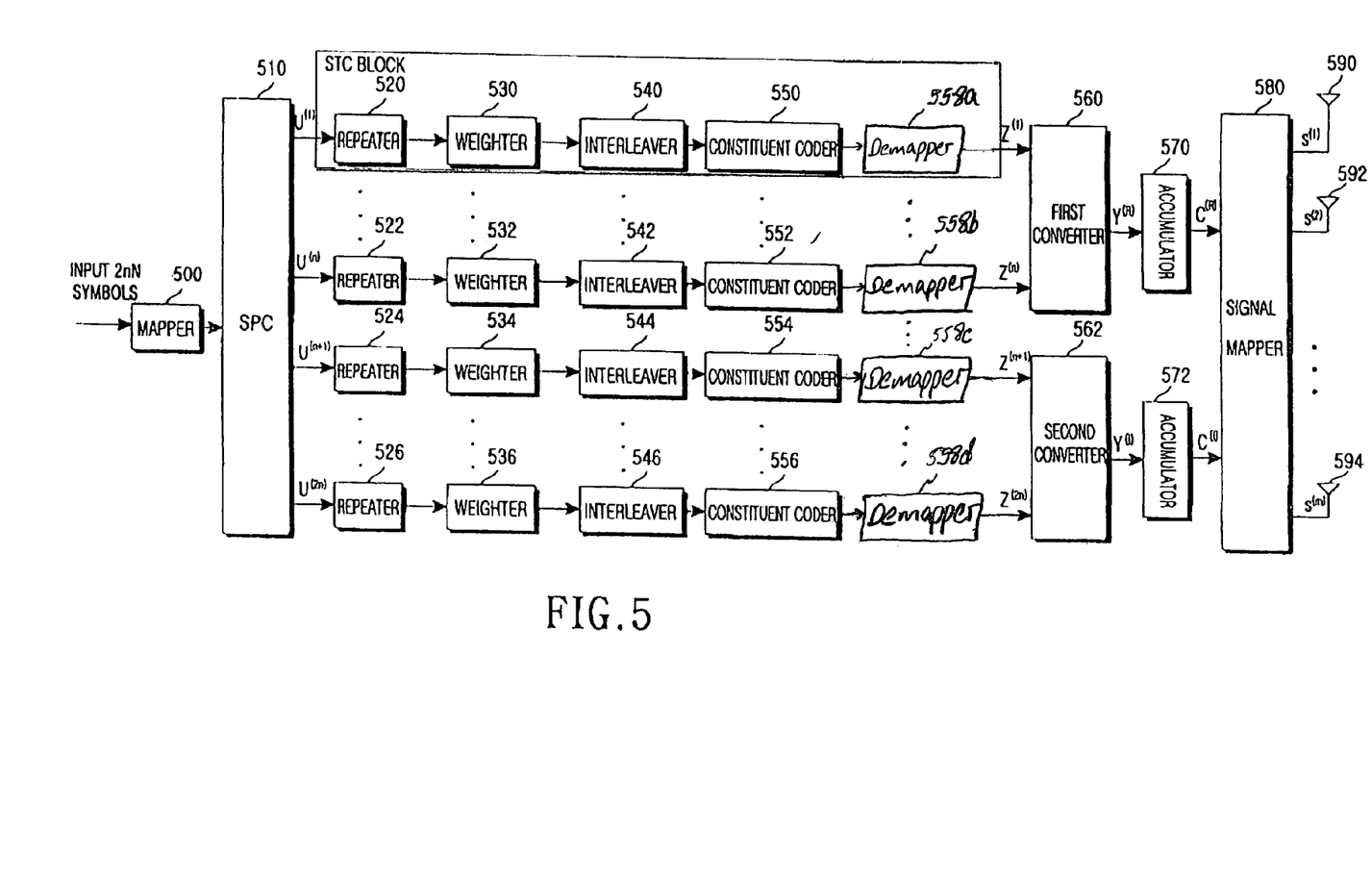
FIG. 5 is a block diagram of a third embodiment of the space-time coder according to the present invention.

FIGS. 3, 4 and 5 illustrate embodiments of a space-time coder with high reliability, which is realized by combining a plurality of transmission/reception antennas and error correction techniques with the non-binary RA coder illustrated in FIG. 2 according to the present invention.

FIG. 3 is a block diagram of an embodiment of the space-time coder using BPSK (Binary Phase Shift Keying) according to the present invention. The pace-time coder is configured by adding a signal mapper (or bit distributor) 312 and a plurality of antennas 314, 316 and 318 to the structure of the RA coder illustrated in FIG. 2. The functional blocks from a mapper 300 to a demapper 310 operate in the same manner as those from the mapper 200 to the demapper 214 illustrated in FIG. 2. Thus, their operations will not be described here.

The demapper 310 outputs a three-bit binary symbol $(c_{i1}, c_{i2}, c_{i3})$ to the signal mapper 312. The signal mapper (or bit distributor) 312 maps the input bits $(c_{i1}, c_{i2}, c_{i3})$ to a BPSK-modulated signal $(s_{i1}, s_{i2}, s_{i3})$. BPSK is a scheme of modulating data using the phase of a carrier having a predetermined amplitude and frequency. The BPSK-modulated signal $(s_{i1}, s_{i2}, s_{i3})$ is transmitted to the receiver through the antennas 314, 316 and 318. The number of the antennas 314, 316 and 318 is related to that of bits mapping to one non-binary symbol output from the demapper 310. In the present invention, since the bit symbol has three bits, three antennas are used to thereby achieve high diversity performance. As described before, the data rate r/m can be up to 1. During an $i^{th}$ time period, the signals $s_{i1}, s_{i2}$ and $s_{i3}$ are transmitted through the antennas 314, 316 and 318, respectively.

FIG. 4 is a block diagram of another embodiment of the space-time coder according to the present invention. Referring to FIG. 4, the transmitter divides transmission data into frames, each frame containing mnN bits. Each mnN-bit frame is further segmented into nN m-bit blocks, where n is the number of sub-frames. A mapper 400 maps the nN blocks to non-binary symbols in the same manner as the mapper 200 illustrated in FIG. 2.

A serial-to-parallel converter (SPC) 300 converts the non-binary nN symbol blocks to n sub-frames, each sub-frame having N blocks. If the n sub-frames are expressed as $U^{(1)}, U^{(2)}, \ldots, U^{(n)}$, a $k^{th}$ sub-frame contains N blocks $$U_0^{(k)}, U_1^{(k)}, \ldots, U_{N-1}^{(k)}.$$

The $k^{th}$ sub-frame $U^{(k)}$ is applied to the input of a $k^{th}$ STC (Space Time code) block by SPC 410.

For the input of the $k^{th}$ sub-frame $U^{(k)}$, the $k^{th}$ STC (Space Time code) block outputs non-binary symbols $Z^{(k)}$ through a repeater with a repetition factor $r(\leq m)$, a weighter, an interleaver, and a coder. To obtain a maximum data rate, r=m. Repeaters 520 to 526, weighters 530 to 536, interleavers 540 to 546 and demappers 550 to 556 comprising 2n STC (Space Time code) blocks each perform the same operations as their counterparts illustrated in FIG. 2, and the 2n STC (Space Time code) blocks have the same components. $Z^{(k)}$ contains rN non-binary symbols $$C_0^{(k)}, C_1^{(k)}, \ldots, C_{rN-1}^{(k)}.$$

A demapper converts each of the rN non-binary symbols to a binary symbol having m bits. That is, the demapper converts an $i^{th}$ non-binary symbol in the $k^{th}$ STC (Space Time code) block, $$C_i^{(k)}$$

to m bits, $$c_{i1}^{(k)}, c_{i2}^{(k)}, \ldots, c_{im}^{(k)}.$$

The bit symbols output from the demappers 460 to 464 are provided to a signal mapper 470. The signal mapper 470 determines a signal $s_{ij}$ to be transmitted through a $j^{th}$ antenna at an $i^{th}$ time using a signal constellation with a set of n bits received from the n demappers $$c_{ij}^{(1)}, c_{ij}^{(2)}, \ldots, c_{ij}^{(n)}.$$

The signal constellation is determined according to n. If n is 2, the signal constellation can be of QPSK (Quadrature Phase-Shift Keying). If n is 3, the signal constellation can be of 8QAM (Quadrature Amplitude Modulation). A signal transmitted through a $j^{th}$ antenna is $s_{0j}, s_{1j}, \ldots, s_{rN-1j}$ where 0 to r indicate transmission time. The number of the transmission antennas 480 to 484 is equal to the repetition factor.

FIG. 5 is a block diagram of a third embodiment of the space-time coder using m antennas according to the present invention. Referring to FIG. 5, the transmitter divides transmission data into frames, each frame containing 2 mnN bits. Each 2 mnN-bit frame is further segmented into 2 nN m-bit blocks. A mapper 500 maps the 2 nN blocks to non-binary symbols in the same manner as the mapper 200 illustrated in FIG. 2.

An SPC 510 converts the non-binary 2 nN symbol blocks to 2 n sub-frames, each sub-frame having N blocks. If the 2 n sub-frames are expressed as $U^{(1)}, U^{(2)}, \ldots, U^{(2n)}$, a $k^{th}$ sub-frame contains N blocks $$U_0^{(k)}, U_1^{(k)}, \ldots, U_{N-1}^{(k)}.$$

The $k^{th}$ sub-frame $U^{(k)}$ is applied to the input of a $k^{th}$ STC (Space Time code) block by SPC 510.

For the input of the $k^{th}$ sub-frame $U^{(k)}$, the $k^{th}$ STC (Space Time code) block outputs non-binary symbols $Z^{(k)}$ through a repeater with a repetition factor $r(\leq m)$, a weighter, an interleaver, and a coder. To obtain a maximum data rate, r=m. Repeaters 520 to 526, weighters 530 to 536, interleavers 540 to 546, coders 550 to 556 and demappers 558a to 558d comprising 2n STC (Space Time code) blocks each perform the same operations as their counterparts illustrated in FIG. 2, and the 2n STC (Space Time code) blocks have the same components. $Z^{(k)}$ contains rN non-binary symbols $$Z_0^{(k)}, Z_1^{(k)}, \ldots, Z_{rN-1}^{(k)}.$$

A demapper converts each of the rN non-binary symbols to a binary symbol having m bits. That is, the demapper converts an $i^{th}$ non-binary symbol in the $k^{th}$ STC (Space Time code) block, $$Z_i^{(k)}$$

to m bits, $$Z_{i1}^{(k)}, Z_{i2}^{(k)}, \ldots, Z_{im}^{(k)}.$$

The bit symbols $z^{(1)}, z^{(2)}, \ldots, z^{(n)}$ output from the demappers 558a to 558b are provided to a first converter 560, and the bit symbols $z^{(n+1)}, z^{(n+2)}, \ldots, z^{(2n)}$ output from the demappers 558c to 558d are provided to a second converter 562. The first converter 560 converts the received bit symbols to real-part symbols $$Y_0^R, Y_1^R, \ldots, Y_{rN-1}^R$$

by modulo $2^n$ by the input integers. The second converter 562 converts the received bit symbols to imaginary-part symbols $$Y_0^I, Y_1^I, \ldots, Y_{rN-1}^I$$

by modulo $2^n$ by the input integers. Thus, the converters 560 and 562 function to convert input n bits to one signal. $i^{th}$ signals $Y_i^R$ and $Y_i^I$ output from the converters 560 and 562 can be expressed as $$(Y_{i1}^R, Y_{i2}^R, \ldots, Y_{im}^R) \text{ and } (Y_{i1}^I, Y_{i2}^I, \ldots, Y_{im}^I), \text{ which are} \qquad (6)$$

$$Y_{ij}^R = z_{ij}^{(1)} + 2z_{ij}^{(2)} + \ldots + 2^{n-1} z_{ij}^{(n)}$$

$$Y_{ij}^I = z_{ij}^{(n+1)} + 2z_{ij}^{(n+2)} + \ldots + 2^{n-1} z_{ij}^{(2n)} \qquad (7)$$

A first accumulator 570 accumulates the real-part symbols $$Y_0^R, Y_1^R, \ldots, Y_{rN-1}^R$$

and outputs a real-part sequence $$C_0^R, C_1^R, \ldots, C_{rN-1}^R$$

and a second accumulator 572 accumulates the imaginary-part symbols $$Y_0^I, Y_1^I, \ldots, Y_{rN-1}^I$$

and outputs an imaginary-part sequence.

$$C_0^I, C_1^I, \ldots, C_{rN-1}^I.$$

Instead of the accumulators 570 and 572, one-tap or two-tap RSC coders can be used.

The accumulated symbols are input to a signal mapper 580. The signal mapper 580 determines a signal $s_{ij}$ to be transmitted through a $j^{th}$ antenna at an $i^{th}$ time by mapping accumulated symbols $(C_i^R, C_i^I)$ in a signal constellation. A signal transmitted through a $j^{th}$ antenna is $s_{0j}, s_{1j}, \ldots, s_{rN-1,j}$ and the number of transmission antennas 590 to 594 is equal to the repetition factor. If the repetition factor is m, m antennas are used.

The receiver receives signals from the m antennas. If the received signals are expressed as $R_0, R_1, \ldots, R_{N-1}$, the log likelihood of each component of $(C_i^R, C_i^I)$ in $R_i$ is calculated and an initial LLR (Log Likelihood Ratio) of a corresponding symbol $Z_i^{(k)}$ is calculated using the log likelihoods. Using the initial LLR, $$Z_i^{(k)}$$

is decoded to $$U_0^{(k)}, U_1^{(k)}, \ldots, U_{N-1}^{(k)}$$

by iterative decoding of concatenated codes through a combiner, a weighter, a deinterleaver, and an accumulator.

In accordance with the present invention, non-binary code symbols have full rank like binary code symbols so that a receiver can receive transmission data without errors. N symbols are repeated by a repetition factor r. The rN repeated symbols are weighted using weighting factors other than zero and thus randomized. Therefore, the performance of channel encoding is improved.

Each of the rN weighted symbols is converted to m bits. The m bits are assigned to m antennas, respectively. To obtain a maximum data rate, r is set to m. Thus, a maximum diversity gain is achieved irrespective of the type of the interleaver.

While the invention has been shown and described with reference to certain preferred embodiments thereof, it will be understood by those skilled in the art that various changes in form and details may be made therein without departing from the spirit and scope of the invention as further defined by the appended claims.

What is claimed is:

1. A mobile communication system using multiple antennas comprising:
    a repeater for receiving non-binary symbols and repeating the non-binary symbols;
    a weighter for weighting the repeated non-binary symbols by multiplying the identical repeated non-binary symbols by corresponding different weighting factors;
    an interleaver for interleaving the weighted non-binary symbols; and
    a coder for coding the interleaved symbols;
    wherein a plurality of binary bits are represented by the non-binary symbol, the repeater repeats the symbols by a repetition factor determined by a data rate of the communication system and a number of the antennas, and a number of the corresponding different weighting factors is equal to the repetition factor.

2. The mobile communication system of claim 1, further comprising a mapper for mapping the plurality of binary bits to a non-binary element over a Galois Field, $GF2^m$, where m is the number of binary bits mapped to the non-binary element.

3. The mobile communication system of claim 2, wherein the weighter has the non-binary elements over a Galois Field, $GF2^m$ as the weighting factors.

4. The mobile communication system of claim 3, wherein the weighter has a number of weighting factors equal to a number of the repeated operation of the repeater and multiply the same repeated symbols by the different weighting factors.

5. The mobile communication system of claim 1, wherein the coder comprises an accumulator.

6. The mobile communication system of claim 1, wherein the coder comprises an Recursive Systematic Convolutional (RSC) code.

7. The mobile communication system of claim 5, wherein the coder comprises an accumulator for receiving the non-binary symbols from the interleaver and sequentially accumulating the non-binary symbols.

8. The mobile communication system of claim 6, wherein the coder comprises an 1-tap Recursive Systematic Convolutional(RSC) code.

9. The mobile communication system of claim 1, further comprising a demapper for mapping the coded non-binary symbols to the plurality of binary bits.

10. The mobile communication system of claim 9, further comprising a signal mapper for assigning the plurality of binary symbols received from the demapper to antennas respectively.

11. A coding method for use in a mobile communication system using multiple antennas, the method comprising the steps of:
    receiving non-binary symbols and repeating the non-binary symbols;
    weighting the identical repeated non-binary symbols by multiplying the repeated non-binary symbols by corresponding different weighting factors;
    interleaving the weighted non-binary symbols; and
    coding the interleaved symbols,
    wherein a plurality of binary bits are represented by a non-binary symbol, the symbols are repeated by a repetition factor determined by a data rate of the communication system and a number of the antennas, and a number of the corresponding different weighting factors is equal to the repetition factor.

12. The method as claimed in claim 11, further comprising the step of mapping the plurality of binary bits to a non-binary element over a Galois Field, $GF2^m$, wherein m is the number of binary bits mapped to the non-binary element.

13. The method as claimed in claim 12, wherein the weighting factors are the non-binary elements over a Galois Field, $GF2^m$.

14. The method as claimed in claim 11, wherein a number of weighting factors are equal to a number of the repeating operation and the same repeated symbols are multiplied by the different weighting factors.

15. The method as claimed in claim 11, wherein the coding is performed by Recursive Systematic Convolutional (RSC) coding, the interleaved non-binary symbols.

16. The method as claimed in claim 11, wherein the coding is performed by sequentially accumulating the interleaved non-binary symbols.

17. The method as claimed in claim 15, wherein the RSC coding is 1-tap RSC coding.

18. The method as claimed in claim 11, further comprising demapping the coded non-binary symbols to the plurality of binary bits.

19. The method as claimed in claim 18, further comprising assigning the plurality of binary symbols to antennas respectively.

20. The method as claimed in claim 14, wherein the weighting factors are $GF2^m$ elements other than zero in the weighting step.

21. A mobile communication system using multiple antennas comprising:
    a repeater for receiving symbols and repeating the symbols;
    a weighter for weighting the repeated symbols by multiplying the identical repeated symbols by corresponding different weighting factors;
    an interleaver for interleaving the weighted symbols; and
    a coder for coding the interleaved symbols,
    wherein a plurality of binary bits are represented by a non-binary symbol, the repeater repeats the symbols by a repetition factor determined by a data rate of the communication system and a number of the antennas, and a number of the corresponding different weighting factors is equal to the repetition factor,
    wherein the mobile communication system further comprises a mapper for mapping the plurality of binary bits to the non-binary element over a Galois Field, $GF2^m$, where m is the number of binary bits mapped to the non-binary element, and a demapper for mapping the encoded non-binary symbols to the plurality of binary bits.

22. The mobile communication system of claim 21, wherein the weighter has the non-binary elements over a Galois Field, $GF2^m$ as the weighting factors.

23. The mobile communication system of claim 22, wherein the weighter has a number of weighting factors equal to a number of the repetition and multiply the same repeated symbols by the different weighting factors.

24. The mobile communication system of claim 21, wherein the coder comprises an accumulator.

25. The mobile communication system of claim 21, wherein the coder comprises an Recursive Systematic Convolutional (RSC) code.

26. The mobile communication system of claim 24, wherein the coder comprises an accumulator for receiving the non-binary symbols from the interleaver and sequentially accumulating the non-binary symbols.

27. The mobile communication system of claim 21, wherein the coder comprises an 1 tap Recursive Systematic Convolutional (RSC) code.

28. The mobile communication system of claim 27, further comprising a signal mapper for assigning the plurality of binary symbols received from the demapper to antennas respectively.

29. A method for use in a mobile communication system using multiple antennas, the method comprising the steps of:
receiving symbols and repeating the symbols;
weighting the identical repeated symbols by multiplying the repeated symbols by corresponding different weighting factors;
interleaving the weighted symbols; and
coding the interleaved symbols,
wherein a plurality of binary bits are represented by a non-binary symbol, the symbols are repeated by a repetition factor determined by a data rate of the communication system and a number of the antennas, and a number of the corresponding different weighting factors is equal to the repetition factor,
wherein the method further comprises the steps of: mapping the plurality of binary bits to a non-binary element over a Galois Field, $GF2^m$, wherein m is the number of binary bits mapped to the non-binary element; and demapping the encoded non-binary symbols to the plurality of binary bits.

30. The method as claimed in claim 29, wherein the weighting factors are the non-binary elements over a Galois Field, $GF2^m$.

31. The method as claimed in claim 29, wherein a number of weighting factors are equal to a number of the repetition and the same repeated symbols are multiplied by the different weighting factors.

32. The method as claimed in claim 29, wherein the coding is performed by Recursive Systematic Convolutional(RSC) coding, the interleaved non-binary symbols.

33. The method as claimed in claim 29, wherein the coding is performed by sequentially accumulating the interleaved non-binary symbols.

34. The method as claimed in claim 32, wherein the RSC coding is a 1 tap RSC coding.

35. The method as claimed in claim 29, further comprising the step of assigning the plurality of binary symbols to antennas respectively.

36. The coding method of claim 31, wherein the weighting factors are $GF2^m$ elements other than zero in the weighting step.

* * * * *